United States Patent
Kim et al.

(10) Patent No.: US 9,105,346 B2
(45) Date of Patent: Aug. 11, 2015

(54) SEMICONDUCTOR DEVICE AND METHOD FOR OPERATING THE SAME

(71) Applicant: SK HYNIX INC., Icheon (KR)

(72) Inventors: Myung Su Kim, Guri (KR); Wan Ik Cho, Anyang (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/177,166

(22) Filed: Feb. 10, 2014

(65) Prior Publication Data

US 2015/0124525 A1   May 7, 2015

(30) Foreign Application Priority Data

Nov. 1, 2013 (KR) .................. 10-2013-0132472

(51) Int. Cl.
*G11C 11/34* (2006.01)
*G11C 16/26* (2006.01)
*G11C 16/10* (2006.01)
*G11C 16/24* (2006.01)

(52) U.S. Cl.
CPC ............. *G11C 16/26* (2013.01); *G11C 16/107* (2013.01); *G11C 16/24* (2013.01)

(58) Field of Classification Search
CPC ..................... G11C 16/0483; G11C 16/10
USPC ......................... 365/185.03, 185.24
See application file for complete search history.

(56) References Cited

U.S. PATENT DOCUMENTS

| | | | |
|---|---|---|---|
| 7,231,340 B2 * | 6/2007 | Burchard et al. | 713/300 |
| 8,416,626 B2 | 4/2013 | Hemink | |
| 8,422,302 B2 | 4/2013 | Hemink | |
| 8,582,365 B2 * | 11/2013 | Kim | 365/185.18 |
| 8,659,966 B2 * | 2/2014 | Choi et al. | 365/211 |

* cited by examiner

Primary Examiner — Michael Tran

(57) ABSTRACT

A semiconductor device comprises a memory cell array comprising memory cells coupled to word lines and bit lines, a voltage generator suitable for generating a drive voltage to be applied to a selected word line, and a control logic suitable for detecting the number of pulses of a program voltage received from the memory cell array in a program operation, storing bias information corresponding to the detected number of pulses in a register, and controlling a level of the program voltage for a subsequent program operation based on the bias information.

19 Claims, 14 Drawing Sheets

SEMICONDUCTOR DEVICE AND METHOD FOR OPERATING THE SAME

CROSS-REFERENCE TO RELATED APPLICATION

This application claims priority to Korean patent application No. 10-2013-0132472, filed on Nov. 1, 2013, the disclosure of which is hereby incorporated in its entirety by reference herein.

BACKGROUND

Embodiments of the present invention relate to a semiconductor device and a method for operating the same, and more particularly to a technology for controlling a program operation of a semiconductor device.

Generally, a memory device receives a write command or a read command from a host. Thereafter, a memory controller in the memory device operates to program data in or read out data from a corresponding cell of a memory cell region.

Memory devices are classified as volatile memory devices or non-volatile memory devices according to whether or not data is retained when a power source is cut off. Recently, electronic appliances have been developed to have lower power consumption and smaller sizes. Thus, flash memory devices, which are a type of non-volatile memory device, have been widely used in various electronic appliances.

A memory cell region of a flash memory device includes a plurality of strings. Each string includes select transistors formed at both ends of memory cells coupled in series to each other. Memory cells formed in different strings may be electrically coupled to each other through a word line.

Individual strings are electrically coupled to a page buffer, which is configured to sense data through a bit line. In order to record data in such a memory cell, a program operation and a verification operation are repeatedly performed a predetermined number of times until the data temporarily stored in the page buffer is programmed in the memory cell.

If a program voltage is applied to a control gate of the memory cell, a tunneling phenomenon occurs in a floating gate of the memory cell so that the program operation is carried out. If an erase voltage is applied to a bulk of the memory cell, the tunneling phenomenon occurs in the floating gate of the memory cell so that an erase operation is carried out. For reference, the program voltage is transferred to the memory cell through a corresponding word line.

BRIEF SUMMARY

Various embodiments of the present invention are directed to a semiconductor device and a method for operating the same, which substantially obviate one or more problems due to limitations and disadvantages of the related art.

An embodiment of the present invention relates to a technology for reducing a program operation time by storing the number of program pulses used for determining an initial level of a program voltage during a program operation of a semiconductor device and using the stored number of program pulses to determine the next level of the program voltage.

In accordance with an embodiment, a semiconductor device comprises: a memory cell array including memory cells, each of which comprises word lines and bit lines; a voltage generator suitable for generating a drive voltage to be applied to a selected word line in response to a program voltage; and a control logic suitable for detecting the number of pulses of the program voltage received from the memory cell array, store the detected number of program voltage pulses in a register, and control the program voltage in response to information stored in the register.

In accordance with another embodiment, a method for operating a semiconductor device comprises: detecting a number of program pulses when 1-bit data passes a verification voltage during a first program operation, storing bias information corresponding to the detected number of program pulses in a first-in-first-out (FIFO) buffer, and increasing an address indicated by a write pointer; reading the bias information stored in the FIFO buffer during a second program operation, re-storing the bias information in the FIFO buffer, and increasing the address indicated by the write pointer and a read pointer; and reading the bias information stored in the FIFO buffer during a third program operation, and increasing address indicated by the read pointer.

It is to be understood that both the foregoing general description and the following detailed description of embodiments is intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to various embodiments of the present invention, examples of which are illustrated in the accompanying drawings. Wherever possible, the same reference numbers will be used throughout the drawings to refer to the same or like parts.

Figure 1:
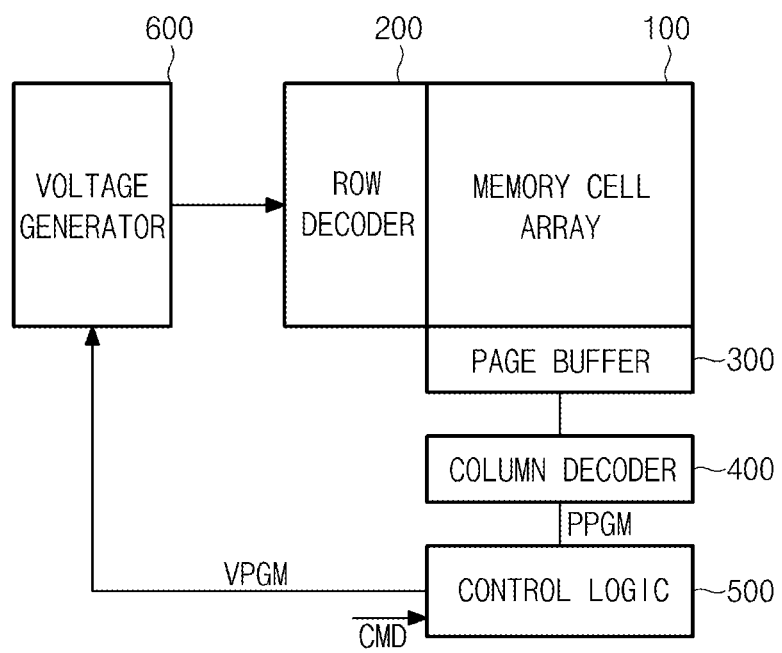
FIG. 1 is a block diagram illustrating a semiconductor device according to an embodiment.

FIG. 1 is a block diagram illustrating a semiconductor device according to an embodiment.

Referring to FIG. 1, the semiconductor device includes a memory cell array 100, a row decoder 200, a page buffer 300, a column decoder 400, a control logic 500, and a voltage generator 600.

The memory cell array 100 includes a plurality of memory cells configured to store program data. The plurality of memory cells is coupled to word lines and bit lines. The memory cell array 100 may have a NAND-type string structure.

The row decoder 200 selects one of a plurality of memory blocks of the memory cell array 100, and selects one of rows (or pages) of the selected memory block. That is, the row decoder 200 selects one of a plurality of word lines of the memory cell array 100 in response to a row address.

The row decoder 200 may provide a program, verification, or read voltage to a selected word line depending on the operational mode of the semiconductor device. In a program operation, the row decoder 200 provides a program voltage to the selected word line and a pass voltage to non-selected word lines.

In a read operation, the row decoder 200 provides a read voltage to the selected word line. The selected row (or page), i.e., the selected word line, is driven by the row decoder 200 in response to a drive voltage from the voltage generator 600.

The page buffer 300 is coupled to a plurality of bit lines of the memory cell array 100. In the read operation, the page buffer 300 senses voltages of the plurality of bit lines, and outputs read data corresponding to the sensed voltages to the column decoder 400. In the program operation, the page buffer 300 temporarily stores data to be programmed in the memory cell array 100.

The page buffer 300 operates as a write driver or a sense-amplifier according to the operational mode of the semiconductor device. The page buffer 300 operates as a sense-amplifier in the read operation, and operates as a write driver in the program operation.

In an embodiment, the page buffer 300 is configured to read or program 1-bit data. In another embodiment, the page buffer 300 is configured to read or program 2-bit data. However, embodiments are not limited thereto. The page buffer 300 may be configured to read or program 3 or more bit data.

The page buffer 300 may include a plurality of unit page buffers each of which corresponds to a bit line. If a memory cell stores multi-bit data, a unit page buffer of the page buffer 300 may include two or more latches.

The column decoder 400 may select a predetermined number of unit page buffers of the page buffer 300. In other words, the column decoder 400 may select a predetermined number of columns of the memory cell array 100 in response to a column address. That is, a predetermined number of unit page buffers are activated in response to the column address, and a predetermined number of columns of the memory cell array 100 coupled to the activated unit page buffers are selected. If the predetermined number of unit page buffers and the predetermined number of columns of the memory cell array 100 are activated, the column decoder 400 may apply a program pulse PPGM, which is received from the memory cell array 100 through the page buffer 300, to the control logic 500.

The control logic 500 may provide overall control of operations of the semiconductor device. Upon receiving a command signal CMD, the control logic 500 detects the number of program pulses (PPGMs) received from the memory cell array 100 through the page buffer 300 and the column decoder 400, and stores the detected number of program pulses (PPGMs) therein. The control logic 500 may determine which one of pages corresponding to each word line is programmed, and detect the number of program pulses of a starting or initial program voltage for the determined page.

The control logic 500 outputs a program voltage VPGM to the voltage generator 600 based on the number of program pulses of the memory cells. That is, the control logic 500 detects the number of program pulses of each memory cell, stores an initial level (or a starting level) of a program voltage, and determines the next level of the program voltage by taking into consideration the initial level of the program voltage during the program operation.

In addition, the control logic 500 may recognize program characteristics (i.e., the number of program pulses) of memory cells coupled to a word line when a first page (e.g., a least significant bit (LSB) page) of the word line is programmed, and may determine an initial level of a program voltage of a next page (e.g., a most significant bit (MSB) page or an intermediate page) based on the program characteristics of the first page. This means that an initial level of a program voltage of a word line can be controlled based on a program result of a first page of the word line.

The voltage generator 600 may generate various drive voltages for performing program, erase, and read operations in response to a control signal from the control logic 500. The drive voltages may include a program voltage, a pass voltage, an erase voltage, a read voltage, a program/erase verification voltage, a refresh verification voltage, etc. In an embodiment, the voltage generator 600 generates a program voltage having a level that changes in response to the program voltage VPGM received from the control logic 500.

Figure 2:
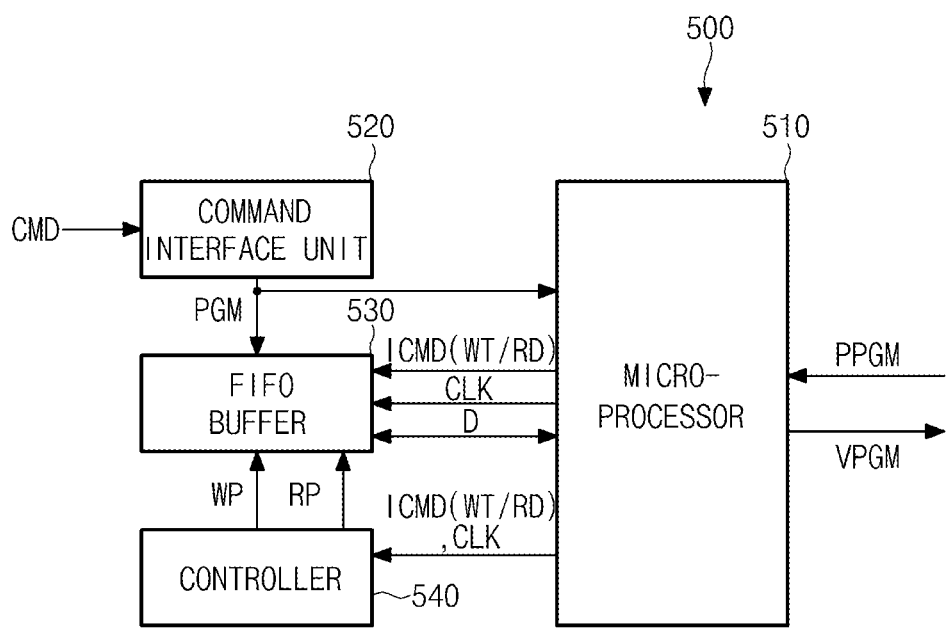
FIG. 2 is a block diagram illustrating a control logic shown in FIG. 1.

FIG. 2 is a block diagram illustrating the control logic 500 shown in FIG. 1.

Referring to FIG. 2, the control logic 500 includes a microprocessor 510, a command interface unit 520, a first-in-first-out (FIFO) buffer 530, and a controller 540.

The microprocessor 510 detects the number of program pulses (PPGMs) received from a selected word line of the memory cell array 100 through the page buffer 300 and the column decoder 400. The microprocessor 510 stores data D corresponding to the number of program pulses in the FIFO buffer 530 in response to a program command, e.g., a program signal PGM, received from the command interface unit 520.

The microprocessor 510 is synchronized with a clock signal CLK to transmit the data D to the FIFO buffer 530 and to read the data D stored in the FIFO buffer 530. The microprocessor 510 outputs an internal command signal ICMD to the FIFO buffer 530.

The internal command signal ICMD output from the microprocessor 510 includes a write signal WT for writing data D and a read signal RD for reading data D. The microprocessor 510 may also provide the clock signal CLK, the write signal WT, and the read signal RD to the controller 540.

The microprocessor 510 generates the program voltage VPGM based on program pulse information, i.e., the data D, stored in the FIFO buffer 530, and outputs the program voltage VPGM to the voltage generator 600. In an embodiment, the program voltage VPGM is generated using an incremental step pulse program (ISPP) scheme by repeatedly performing a program loop based on the program pulse information, i.e., the number of program pulses.

The voltage generator 600 provides a drive voltage, e.g., a program voltage, to the selected word line of the memory cell array 100. The drive voltage is generated based on the program voltage VPGM from the microprocessor 510.

The command interface unit 520 receives the external command signal CMD by communicating with an external part, e.g., an external memory controller, a host system, or a computing system. In accordance with an embodiment, the program operation is carried out in response to the external command signal CMD received through the command interface unit 520.

The command interface unit 520 outputs the program signal PGM for performing the program operation to the FIFO buffer 530 and the microprocessor 510 upon receiving the external command signal CMD. In an embodiment, the command interface unit 520 outputs the program signal PGM, e.g., a first program command, a second program command, or a third program command, to the FIFO buffer 530 and the microprocessor 510.

The FIFO buffer 530 stores program pulse information corresponding to a program voltage applied to pages of each word line. In an embodiment, the FIFO buffer 530 includes a flip-flop register. The FIFO buffer 530 may sequentially store input data, and output the stored data according to a FIFO scheme. To control the program voltage, information regarding the number of program pulses of an initial program voltage used for a previous program operation should be stored somewhere in the semiconductor device. In accordance with this embodiment, the information regarding the number of program pulses is stored in the FIFO buffer 530 as the program pulse information. A FIFO buffer is implemented per plane.

The semiconductor device according to the embodiment can be applied to triple-level-cell (TLC) products. Since an F16 nm 65G TLC product does not include a flag cell, the information regarding the number of program pulses is stored using the FIFO buffer 530.

A block copy concept is applied using a single-level-cell buffer to a triple-level-cell (TLC) region. That is, a block address is not changed before data in one block of the TLC product is completely copied to single level cells. Accordingly, it may be possible to store bias information in the TLC product using a small number of FIFO buffers.

A TLC product is configured to perform a first program, a second program, and a third program in a predetermined order during a program operation. During the first program, the number of 1-bit pass pulses is stored in the FIFO buffer 530. After that, the TLC product performs the second program and the third program in the program operation based on the number of 1-bit pass pulses. The number of 1-bit pass pulses represents how many times a level of a program voltage is increased according to the ISPP scheme until a threshold voltage of 1-bit data reaches a verification voltage, i.e., the 1-bit data is determined to be passed.

A semiconductor device according to an embodiment can control an initial program voltage for reducing a program operation time using a register that has a plurality of regions, e.g., three regions. The semiconductor device may store initial bias information for each word line of all blocks (i.e., the number of initial program pulses) using a register group of the FIFO buffer 530.

Both program pulses for controlling an initial bias and information (program pulse information) acquired from a previous program (e.g., a first program or LSB program) may be used for a subsequent process (e.g., a second program or third program (or MSB program)). If word line information (program pulse information) is written or read out using the FIFO buffer 530, data can be efficiently managed.

The controller 540 is controlled by the microprocessor 510. The controller 540 increases an address of the FIFO buffer 530 one by one using a write pointer WP or a read pointer RP when data D is written in or read from the FIFO buffer 530. The write pointer WP is a control signal for changing a write address region of the FIFO buffer 530, and the read pointer RP is a control signal for changing a read address region of the FIFO buffer 530.

In other words, the write pointer WP designates an address region in which data D is to be written in the FIFO buffer 530. The read pointer RP designates an address region from which data is to be read in the FIFO buffer 530.

Embodiments may be applied not only to a TLC product but also to other multi-level-cell (MLC) products. For example, the number of 1-bit pass program pulses detected when programming an LSB page is stored in the FIFO buffer 530, and the address designated by the write pointer WP is increased by one. When programming an MSB page, pre-stored program pulse information is read from the FIFO buffer 530, and the address designated by the read pointer RP is increased by one.

Figure 3:
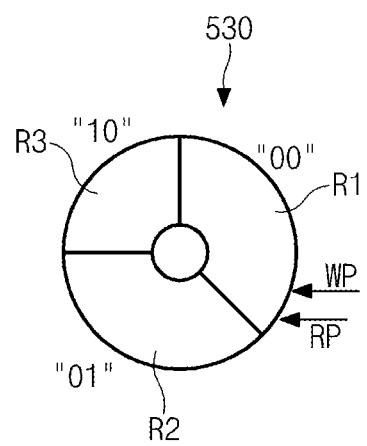
FIGS. 3 to 5 are diagrams illustrating operations of a first-in-first-out (FIFO) buffer shown in FIG. 2.
Figure 4:
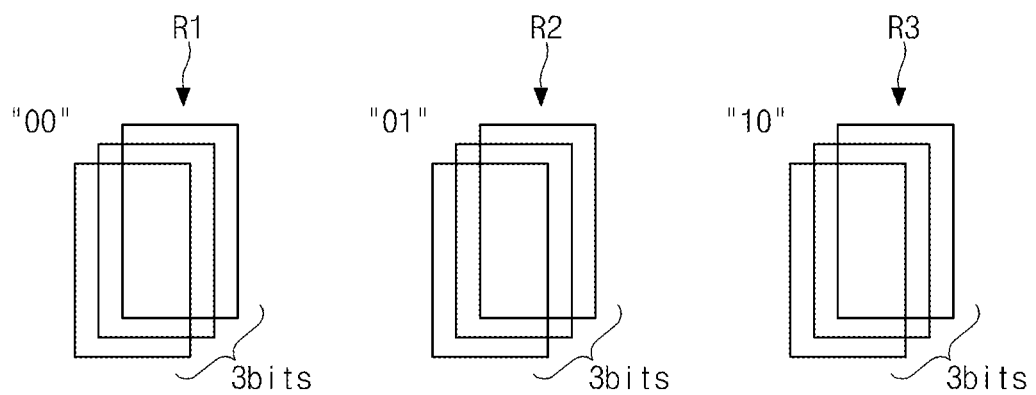
Figure 5:
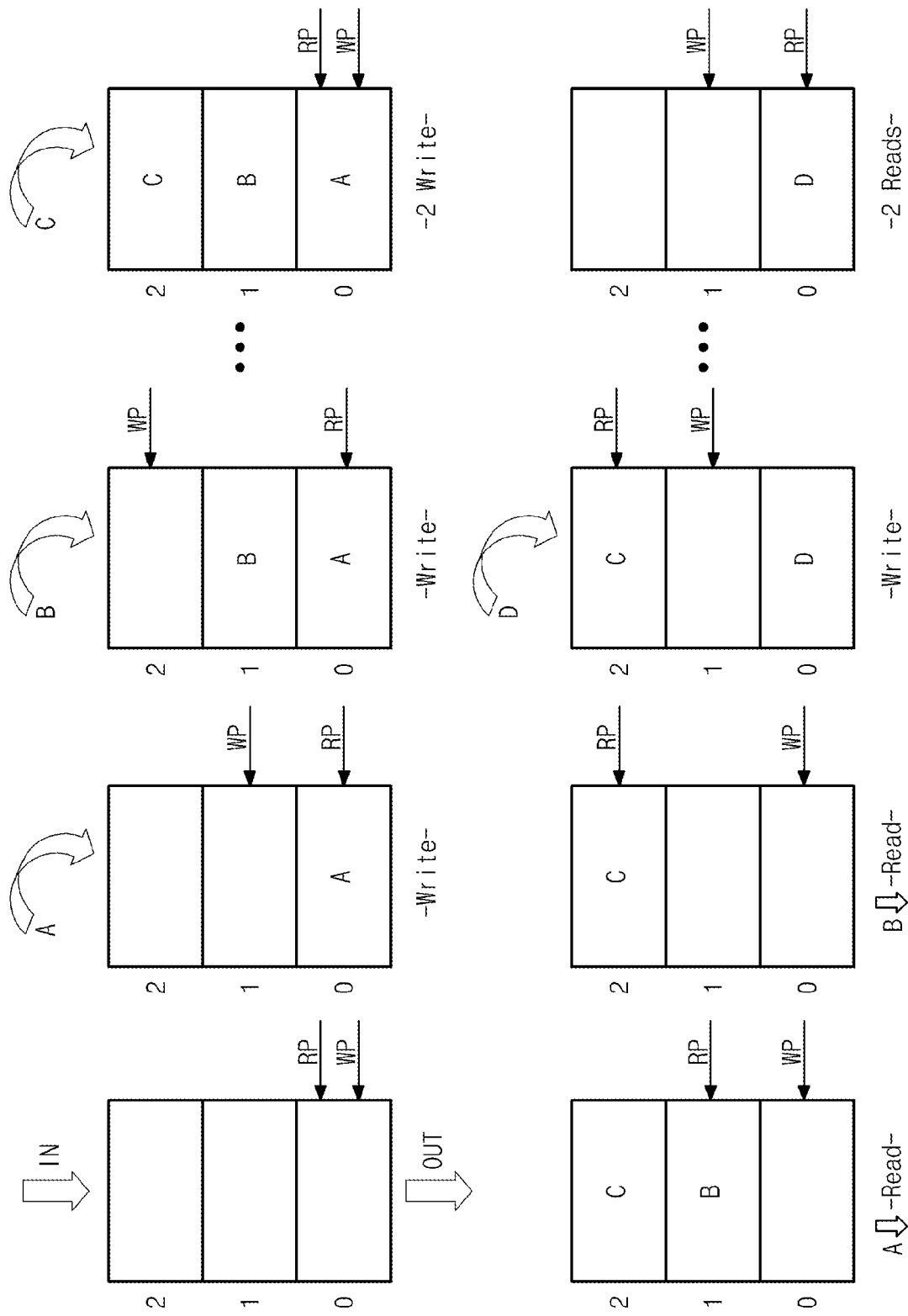

FIGS. 3 to 5 are diagrams illustrating the FIFO buffer 530 shown in FIG. 2.

Various methods for reducing a program time may be used in a NAND flash memory device. In an embodiment, the number of 1-bit pass pulses obtained from a previous program is stored for each word line, such that the stored number of 1-bit pass pulses may be used for the next program for each word line.

In other words, the number of 1-bit pass pulses obtained from a first program or a least significant bit (LSB) program may be used for a second, third, or MSB program. Thus, when starting a program operation for a current word line using a program voltage that has an initial bias level higher than a default value, which is determined using the number of stored program pulses, it is possible to reduce the number of initial program pulses for the current word line. If the number of start program pulses is reduced, a program time for the current word line can be reduced.

In accordance with an embodiment, the number of start program pulses is stored in the FIFO buffer 530. The FIFO buffer 530 is configured to perform a buffer function that sequentially stores input data and outputs stored data according to a first-input-first-output scheme.

Referring to FIG. 3, in a TLC product, a FIFO buffer, e.g., the FIFO buffer 530, may include three register regions R1 to R3. The first register region R1 is indicated by an address "00", the second register region R2 is indicated by an address "10", and the third register region R3 is indicated by an address "10". That is, "00", "01", and "10" denote addresses of the three register regions R1 to R3 of the FIFO buffer 530.

FIG. 4 illustrates the register regions R1 to R3, each of which may store 3-bit data.

FIG. 5 illustrates an operation of the FIFO buffer 530. The FIFO buffer 530 sequentially stores data in regions "0", "1", and "2", and sequentially outputs data of the regions "0", "1", and "2". Data may be input in or output from each register region of the FIFO buffer 530 in response to a write pointer WP or a read pointer RP.

The write pointer WP and the read pointer RP are controlled by the controller 540. The controller 540 may increase an address of the FIFO buffer 530 one by one using the write pointer WP or the read pointer RP during a write operation mode or a read operation mode, respectively.

Referring to FIG. 5, after data "A" is stored in the region "0", the address indicated by the write pointer WP is increased by one to indicate the region "1". After that, data "B" is stored in the region "1", and the address indicated by the write pointer WP is increased by one to indicate the region "2". The address indicated by the write pointer WP is increased again after data "C" is stored in the region "2". Since there are three regions in the FIFO buffer 530, the write pointer WP indicates the region "0" after the data "C" is stored in the region "2".

Thereafter, the data "A" is read out of the region "0", and the address indicated by the read pointer RP is increased by one to indicate the region "1". After that, the data "B" is read out of the region "1", and the address indicated by the read pointer RP is increased by one to indicate the region "2".

Subsequently, data "D" is written in the region "0", and the address indicated by the write pointer WP is increased by one to indicate the region "1". Thereafter, the data "C" is read out of the region "2", and the address indicated by the read pointer RP is increased by one to indicate the region "0" again.

Figure 6:
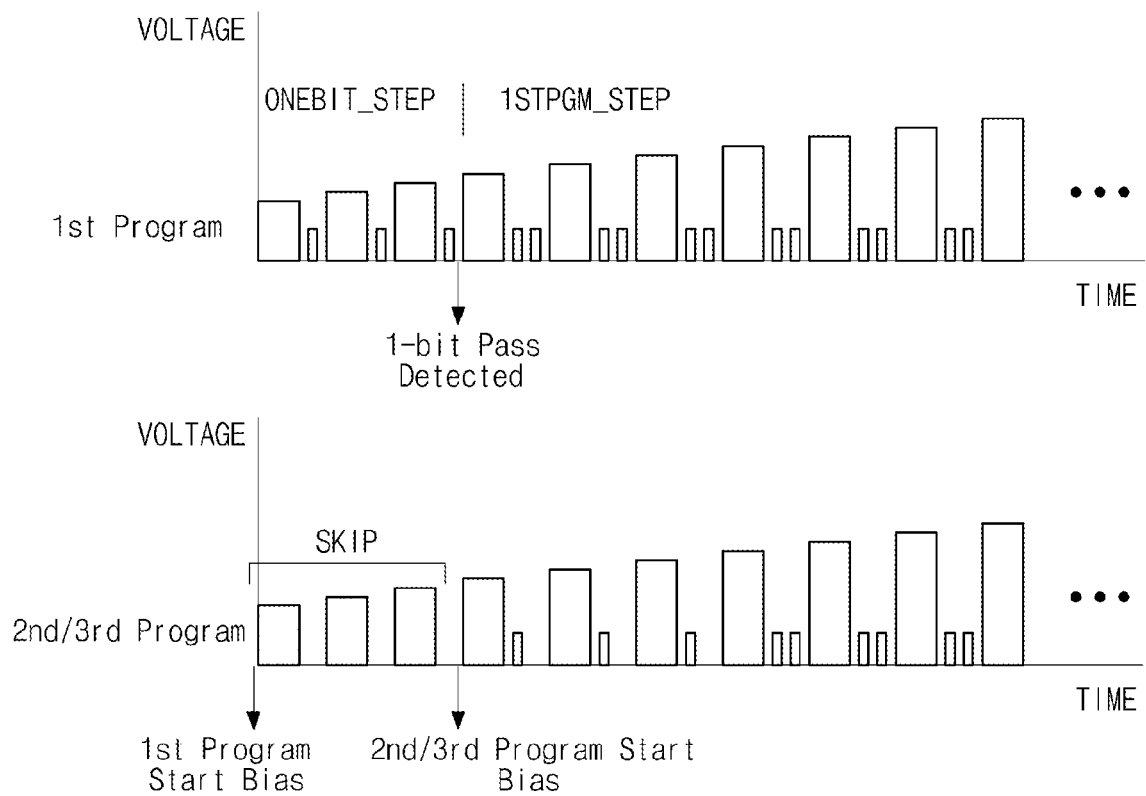
FIG. 6 is a conceptual diagram illustrating operations of a microprocessor shown in FIG. 2.

FIG. 6 is a conceptual diagram illustrating operations of the microprocessor 510 shown in FIG. 2.

In FIG. 6, an X-axis denotes an elapsed period of time, and a Y-axis denotes a program voltage applied to word lines coupled to memory cells, according to an ISPP scheme.

The microprocessor 510 stores the number of 1-bit pass pulses in the FIFO buffer 530 after a first program operation is performed. Second and third program operations are performed using information stored in the FIFO buffer 530.

A flash memory device is configured to program memory cells using a tunneling phenomenon, and the ISSP scheme is applied to the flash memory device so as to make a dense distribution of threshold voltages in a program state.

The flash memory device programs memory cells by applying a program voltage in each program loop, and verifies a program state by comparing a threshold voltage of memory cells with a verification voltage. According to the ISPP scheme, in each step, a program voltage increased by a predetermined level is applied to each memory cell whose threshold voltage does not reach the verification voltage.

If a threshold voltage of a memory cell reaches the verification voltage, the program operation for the memory cell is terminated. The microprocessor 510 may set up an ISPP voltage within a time period when the number of 1-bit pass pulses is detected.

When applying the ISPP voltage to the memory cells in the first program operation, an initial level of the program voltage is low so that there is a time period in which a threshold voltage of 1-bit data does not reach the verification voltage, i.e., the 1-bit data does not pass program verification. Accordingly, the microprocessor 510 detects the number of program pulses toggled until 1-bit data is passed in the first program operation. If 1-bit data is determined as being passed, the first program operation is completed.

During the second or third program operation, the number of 1-bit pass pulses detected in the first program operation may be used. That is, a time period beginning with a program start bias and ending with a 1-bit data pass voltage, which is taken in the first program operation, is skipped, and the second or third program operation is carried out using an ISPP voltage obtained when 1-bit data is passed as a program start bias. As a result, the second and third program operations can reduce a program operation time by the skipped time period.

Figure 7:
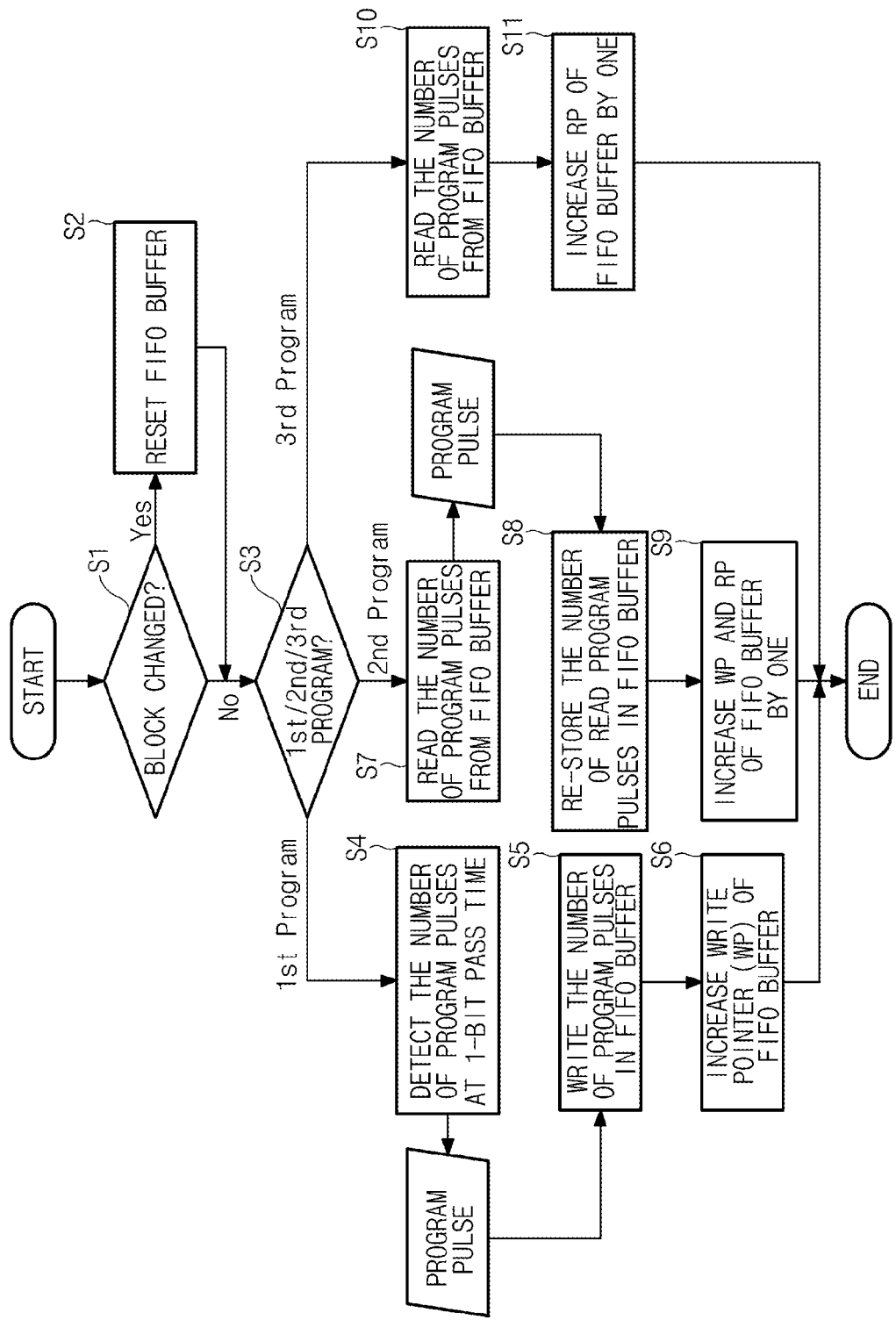
FIG. 7 is a flowchart illustrating a method for operating a semiconductor device according to an embodiment.

FIG. 7 is a flowchart illustrating a method for operating a semiconductor device according to an embodiment.

A method for storing data in the FIFO buffer 530 when a program command is applied to the semiconductor device will be described in detail.

Referring to FIG. 7, the microprocessor 510 determines whether or not a different block than a block selected for a previous program operation is selected for a current program operation from the memory cell array 100 at step S1. If the selected block is changed, the FIFO buffer 530 is reset so that an operation of storing the number of 1-bit pass pulses restarts at step S2.

In other words, if a block address is changed during a sequence of program operations, all information pre-stored in the FIFO buffer 530 is reset. Information regarding a new block is stored in the FIFO buffer 530, and then the control of a program voltage is performed from a word line designated in a first program operation for the new block.

Thereafter, the microprocessor 510 determines whether a program command received from the command interface unit 520 is a first program command, a second program command, or a third program command at step S3. In a first program stage, the microprocessor 510 detects the number of program pulses at a specific time at which a threshold voltage of 1-bit data passes a verification voltage at step S4. The microprocessor 510 writes information regarding the number of program pulses in the FIFO buffer 530 at step S5.

The microprocessor 510 detects the number of start program pulses based on program pulses (PPGMs) received from the memory cell array 100 through the page buffer 300 and the column decoder 400, and then stores the number of start program pulses in the FIFO buffer 530. After the number of start program pulses is stored in the FIFO buffer 530, the controller 540 increases an address indicated by a write pointer WP among the register groups R1 to R3 of the FIFO buffer 530 by one at step S6.

Thereafter, in a second program stage, information detected from the first program stage is read out of the FIFO buffer 530, and the read-out information is stored again in the FIFO buffer 530.

The microprocessor 510 reads the information stored in the FIFO buffer 530 at step S7 so that the read-out information is used for a second program. After that, the microprocessor 510 re-stores the information regarding the number of program pulses in the FIFO buffer 530 at step S8. Accordingly, the controller 540 increases the addresses indicated by each of the write pointer WP and a read pointer RP of the register groups R1 to R3 of the FIFO buffer 530 by one at step S9.

In a third program stage, the information re-stored in the FIFO buffer 530 in the second program stage is read out to be used for a third program at step S10. The controller 540 increases the address indicated by the read pointer RP by one at step S11.

Figure 8:
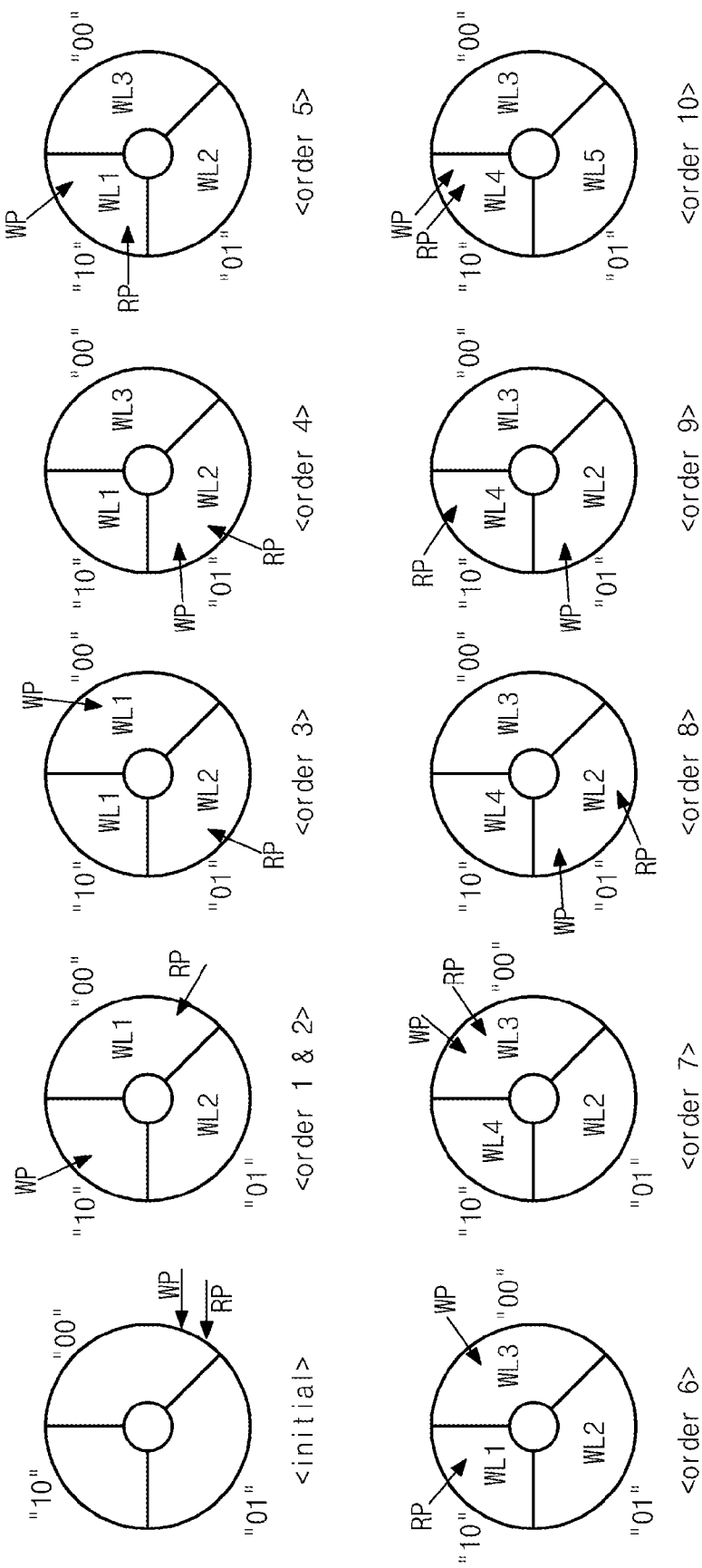
FIGS. 8 to 12 are conceptual diagrams illustrating methods for operating a semiconductor device according to embodiments.

FIG. 8 is a diagram illustrating a method for operating a semiconductor device according to an embodiment.

Referring to FIG. 8, the microprocessor 510 stores bias information per word line in the FIFO buffer 530. For example, assuming the memory cell array 100 includes word lines WL0 to WL7, the microprocessor 510 stores bias information for each of the word lines WL0 to WL7 in registers of the FIFO buffer 530 through a first program operation, a second program operation, and a third program operation.

Table 1 shows the order for storing the bias information in the FIFO buffer 530, which is determined by the microprocessor 510.

TABLE 1

|  | First Program | Second Program | Third Program |
| --- | --- | --- | --- |
| WL0 | 0 |  |  |
| WL1 | 1 | 3 | 6 |
| WL2 | 2 | 5 | 9 |
| WL3 | 4 | 8 | 12 |
| WL4 | 7 | 11 | 15 |
| WL5 | 10 | 14 | 18 |
| WL6 | 13 | 17 | 21 |
| WL7 | 16 | 20 | 24 |

As can be seen from Table 1, assuming that the word line WL0 is coupled to only single-level cells, a bias value of program pulses of the word line WL0 is not stored in the FIFO buffer 530. During the first program operation, initial bias information is stored in the FIFO buffer 530. During the second program operation, the initial bias information stored in the FIFO buffer 530 is read out, and then the read-out information is written again in the FIFO buffer 530. During the third program operation, the bias information stored in the FIFO buffer 530 is read out again.

For example, in an initial state, a write pointer WP and a read pointer RP indicate a register region corresponding to an address "00". Thereafter, in a first program operation for the word lines WL1 and WL2, bias information for the word lines WL1 and WL2 is stored in register regions corresponding to the address "00" and an address "01" in the FIFO buffer 530, respectively (see order 1 & 2). At this time, the read pointer RP still indicates the register region corresponding to the address "00", and the write pointer WP is changed to indicate a register region corresponding to an address "10".

In a second program operation for the word line WL1, the bias information of the word line WL1 stored in the register region corresponding to the address "00" is read out, and the bias information of the word line WL1 is written again in the register region corresponding to the address "10" (see order 3). Thus, the read pointer RP is changed to indicate the register region corresponding to the address "01", and the write pointer WP is changed to indicate the register region corresponding to the address "00". Subsequently, in a first program operation for the word line WL3, bias information of the word line WL3 is written in the register region corresponding to the address "00", and the write pointer WP is changed to indicate the register region corresponding to the address "01" (see order 4).

In a third program operation for the word line WL1, the bias information stored in the register region corresponding to the address "10" is read out, and the read pointer RP is changed to indicate the register region corresponding to the address "00" (see order 6).

The remaining operations for the word lines, e.g., WL2 to WL7 are performed in a similar manner as the operations performed for the word line WL1. Thus, the descriptions therefor are omitted herein for simplicity of explanation.

Figure 9:
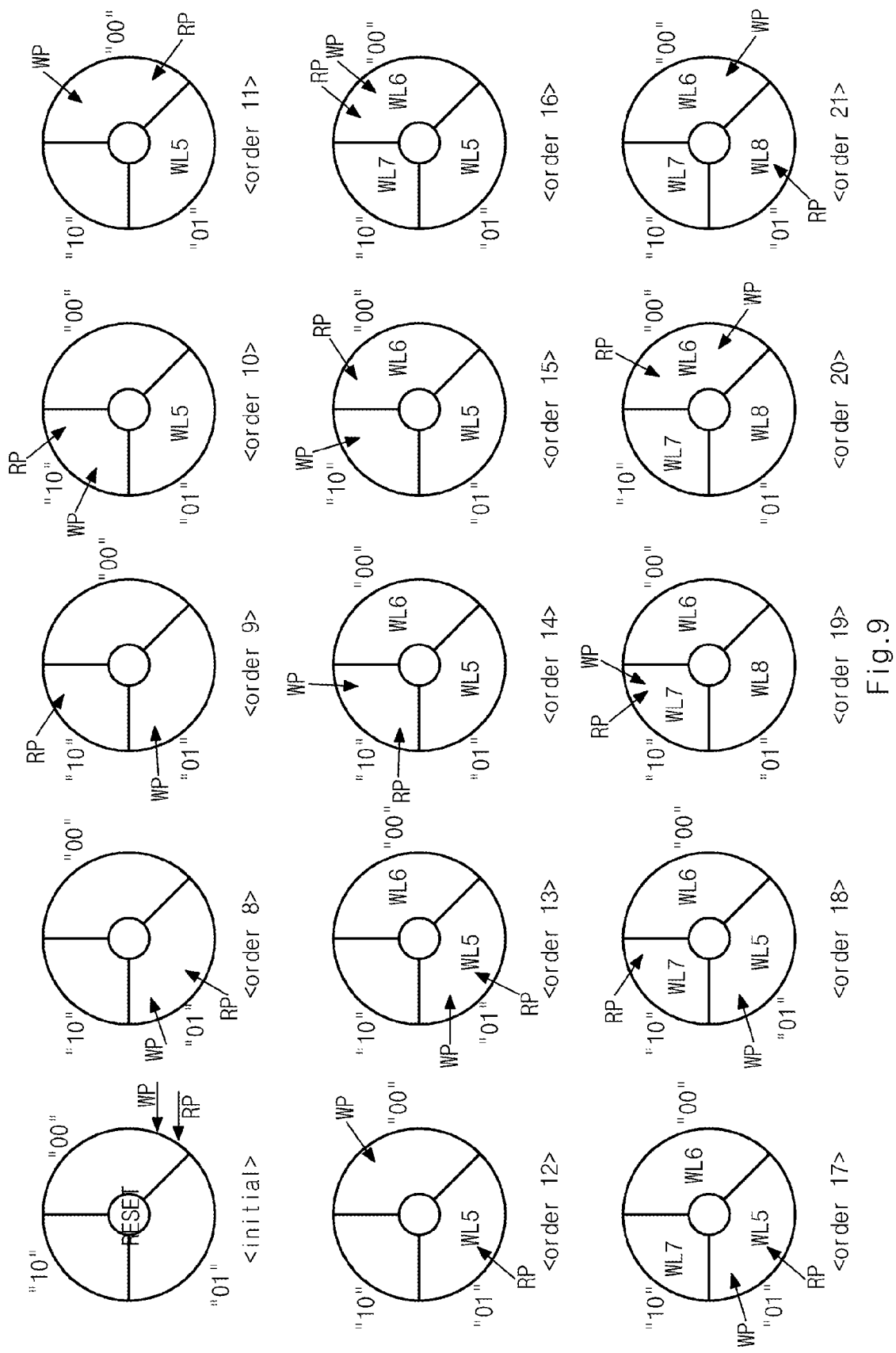

FIG. 9 is a diagram illustrating that a memory block is changed according to a method for operating a semiconductor device according to an embodiment. FIG. 9 shows that a memory block that is changed during the second program operation.

The microprocessor 510 resets the FIFO buffer 530 when the memory block is changed. During the second program operation, the write pointer WP and the read pointer RP are changed, and return to the first program operation so as to store data of the word line WL5.

Figure 10:
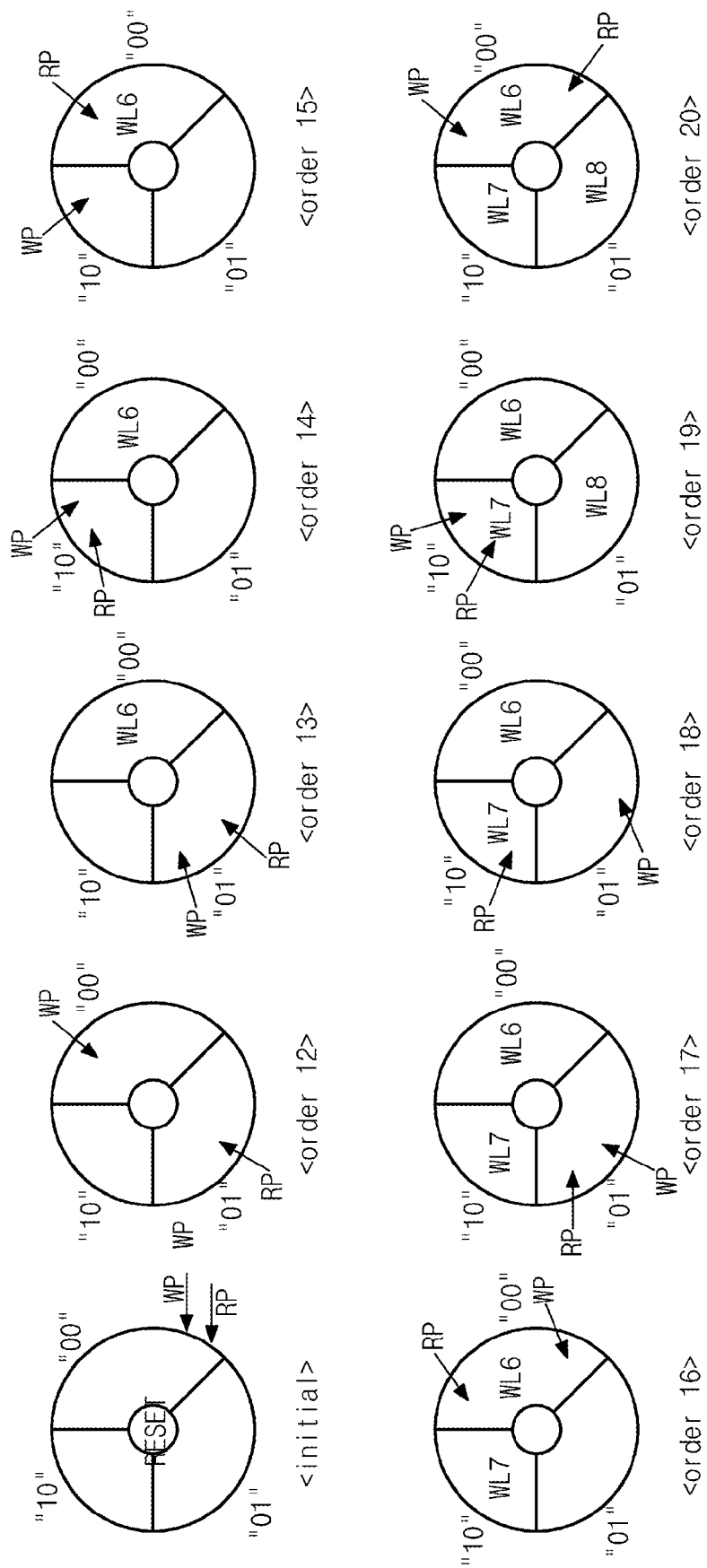

FIG. 10 is a diagram illustrating that a memory block is changed according to a method for operating a semiconductor device according to an embodiment. FIG. 10 shows a memory block that is changed during a third program operation.

If the memory block is changed, the microprocessor 510 resets the FIFO buffer 530. During the third program operation, the write pointer WP and the read pointer RP are changed, and return to the first program operation so as to store data of the word line WL6.

Figure 11:
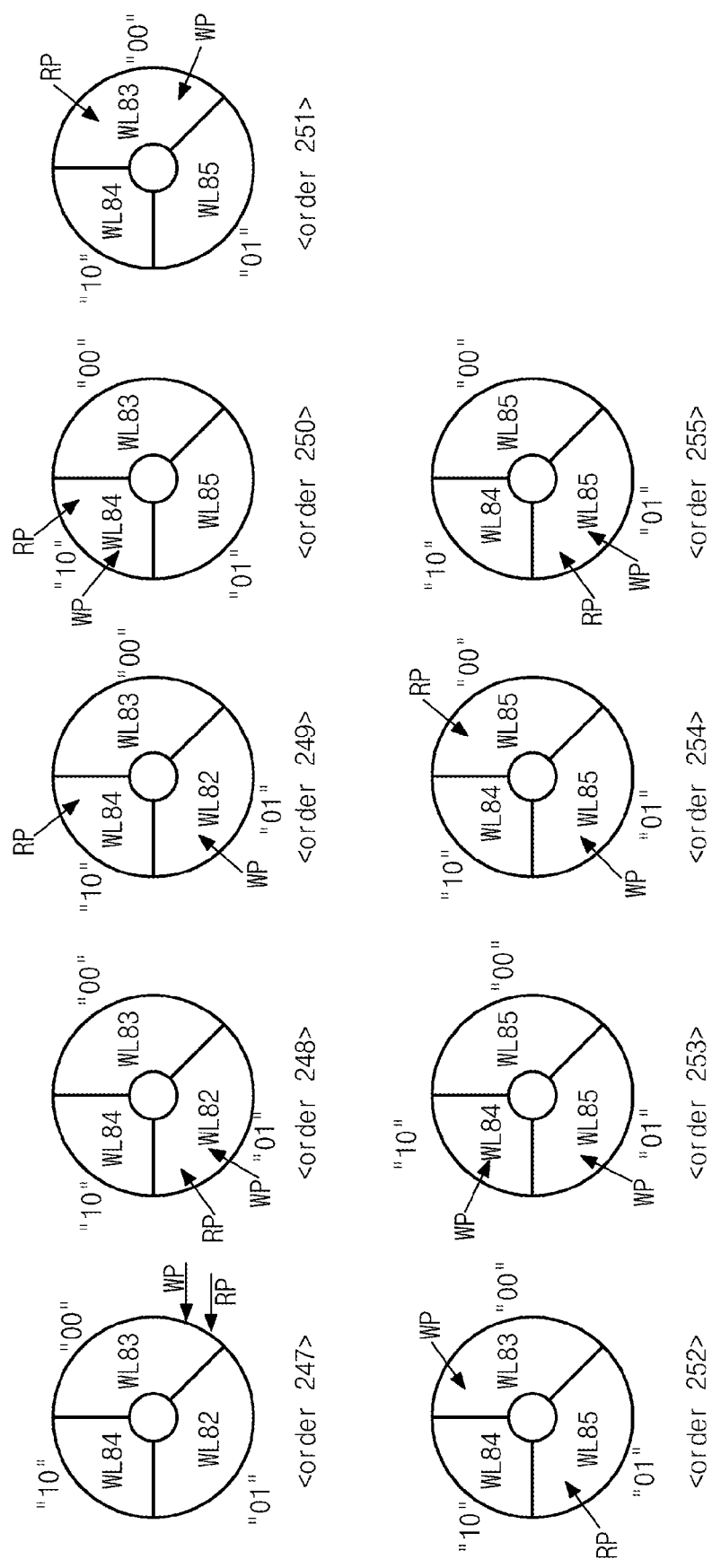

FIG. 11 is a diagram illustrating a program operation of the last page in a method for operating a semiconductor device according to an embodiment. Referring to FIG. 11, data of a word line WL85 is read during the third program operation.

Figure 12:
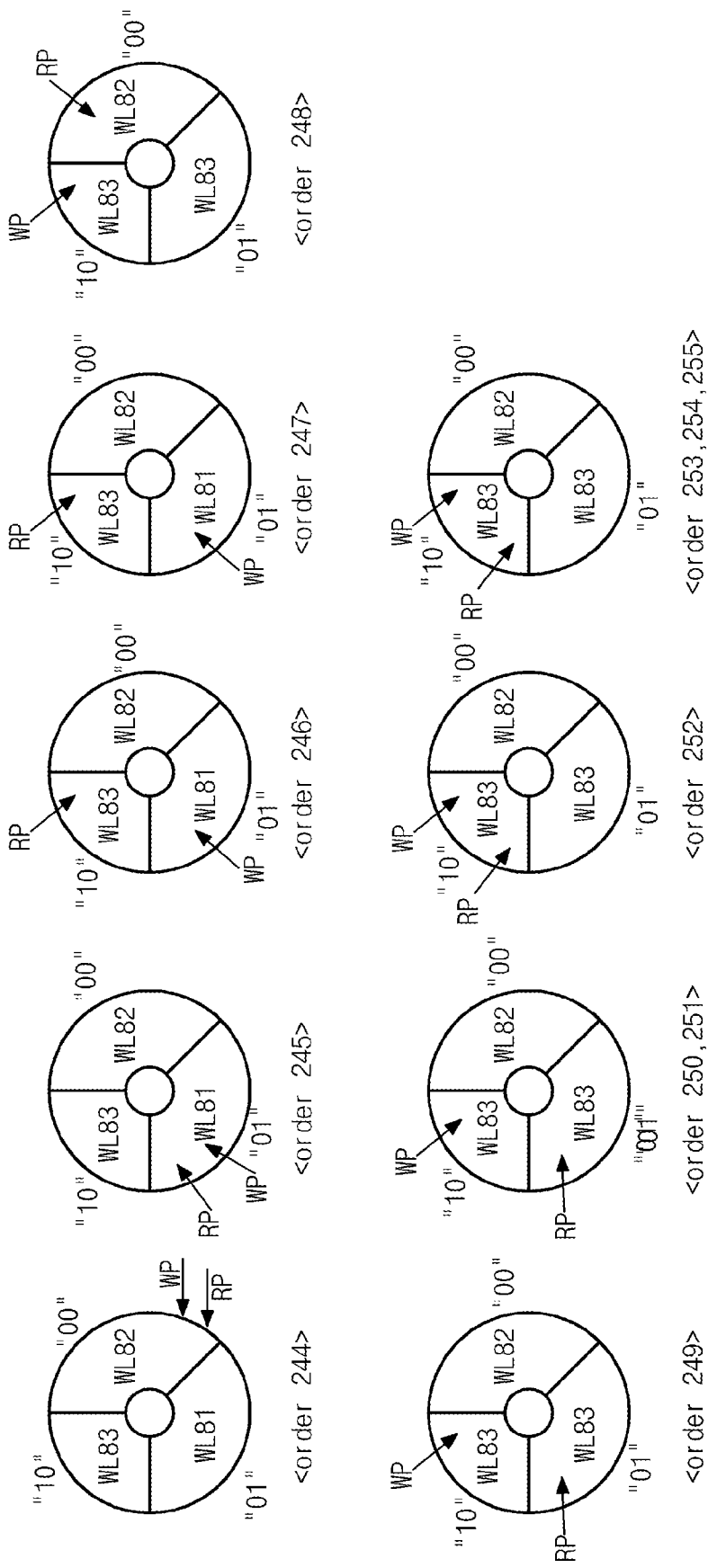

FIG. 12 is a diagram illustrating a program operation in a method for operating a semiconductor device according to an embodiment. FIG. 12 shows that bias information of a word line is stored differently from the embodiment shown in FIG. 11.

Figure 13:
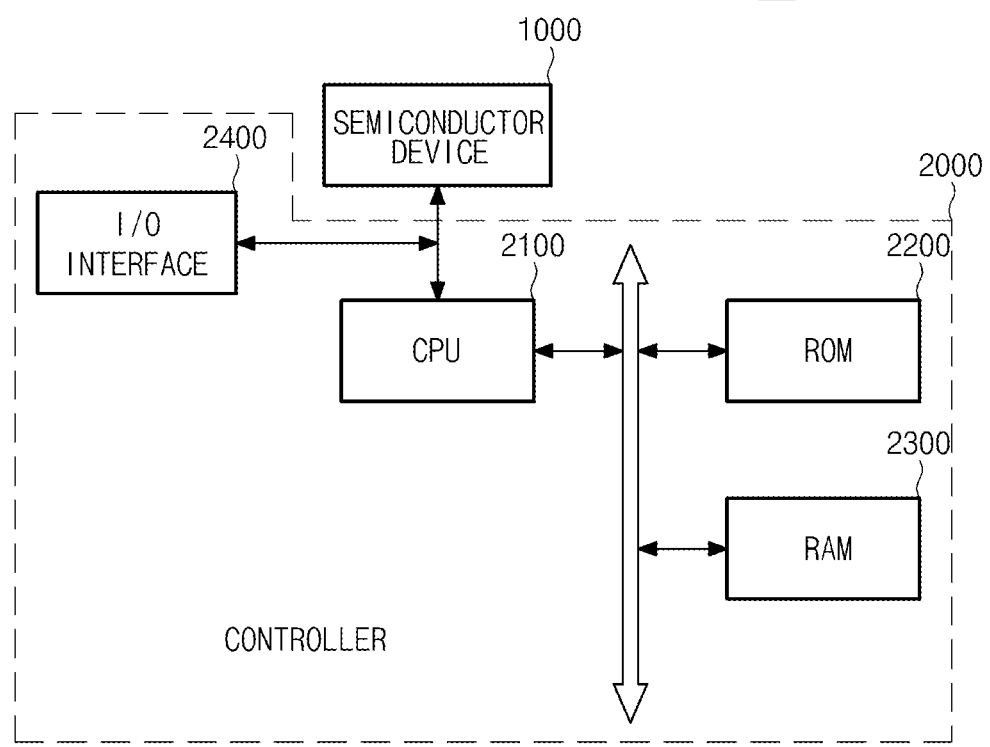
FIG. 13 is a block diagram illustrating a semiconductor system including a semiconductor device according to an embodiment.

FIG. 13 is a block diagram illustrating a semiconductor system 10 including a semiconductor device according to an embodiment.

Referring to FIG. 13, the semiconductor system 10, e.g., a smart card, includes a semiconductor device 1000 and a controller 2000. The semiconductor device 1000 may have a configuration that is substantially the same as that shown in FIG. 1. The controller 2000 controls the semiconductor device 1000, and includes a central processing unit (CPU) 2100, a read only memory (ROM) 2200, a random access memory (RAM) 2300, and an input/output (I/O) interface 2400.

The CPU 2100 may control the semiconductor system 10 based on various programs stored in the ROM 2200, and the I/O interface 2400 may provide an interface with an external part.

A flash memory device is a non-volatile memory device capable of maintaining stored data when powered off. With the increasing number of users who use mobile devices such as cellular phones, PDA digital cameras, portable game consoles, MP3 players (MP3Ps), and so on, the flash memory device has been widely used not only for data storage, but also for code storage. The flash memory device can also be applied to home applications, for example, HDTVs, DTVs, routers, global positioning systems (GPSs), etc.

Embodiments of the present disclosure are implemented by not only a method and an apparatus, but may also be implemented using a program for realizing a function corresponding to the construction of the embodiments of the present disclosure or a recording medium on which such a program is recorded. Implementations can be easily achieved by those having ordinary skill in the art to which the present disclosure pertains from the above descriptions of various embodiments.

Figure 14:
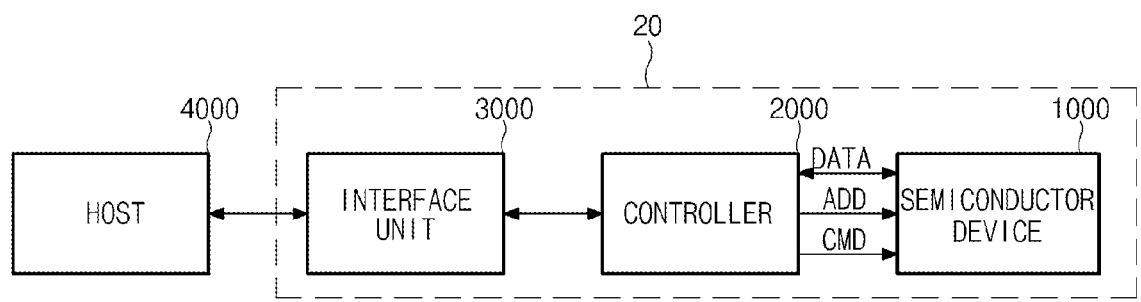
FIG. 14 is a block diagram illustrating a semiconductor system including a semiconductor device according to an embodiment.

FIG. 14 is a block diagram illustrating a semiconductor system 20 including a semiconductor device according to an embodiment.

Referring to FIG. 14, the semiconductor system 20 may include a multi media card (MMC), a secure digital (SD) card, a multiuse card, a micro SD card, a memory stick, a compact SD card, an ID card, a personal computer memory card international association (PCMCIA) card, a solid state disc (SSD) card, a chip card, a smart card, a universal serial bus (USB), etc.

The semiconductor system 20 includes a semiconductor device 1000, a controller 2000 for controlling the semiconductor device 1000, and an interface unit 3000 for interfacing with an external host 4000.

The interface unit 3000 may exchange a variety of information with the external host 4000, and may be configured to use different protocols. The controller 2000 may control a write operation, a read operation, and other states of the semiconductor device 1000 in response to a control signal and a command signal received from the host 4000 through the interface unit 3000.

In more detail, the controller 2000 may provide data DATA, an address ADD, and a command signal CMD to the semiconductor device 1000. The semiconductor device 1000 may have a configuration that is substantially the same as that of the semiconductor device shown in FIG. 1. The controller 2000 may generate the command signal CMD for controlling the semiconductor device 1000.

As is apparent from the above descriptions, a semiconductor device and a method for operating the same according to an embodiment can reduce the size of a control logic configured to control a program voltage, and can reduce a program operation time.

Those skilled in the art will appreciate that embodiments of the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above descriptions. All changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a memory cell array comprising memory cells, each of which comprises word lines and bit lines;
    a voltage generator suitable for generating a drive voltage to be applied to a selected word line in response to a program voltage; and
    a control logic suitable for detecting the number of pulses of the program voltage received from the memory cell array, storing the detected number of program voltage pulses in a register, and controlling the program voltage in response to information stored in the register,
    wherein the control logic detects the number of pulses when 1-bit data passes a verification voltage during a first program operation, and stores a voltage corresponding to the detected number of pulses as an initial program voltage in the register.

2. The semiconductor device according to claim 1, wherein the register comprises a first-in-first-out (FIFO) buffer.

3. The semiconductor device according to claim 1, wherein the memory cell array comprises a triple-level cell (TLC).

4. The semiconductor device according to claim 1, wherein the control logic comprises:
    a first-in-first-out (FIFO) buffer;
    a microprocessor suitable for storing bias information in the FIFO buffer when the 1-bit data passes the verification voltage during the first program operation, and controlling a level of the program voltage based on the bias information during a second program operation; and
    a controller suitable for controlling a data input/output (I/O) operation of the FIFO buffer,
    wherein the first program operation corresponds to an initial program operation and the second program operation follows the first program operation as a subsequent program operation.

5. The semiconductor device according to claim 4, wherein the control logic further comprises:
    a command interface unit suitable for applying a program command to the FIFO buffer and the microprocessor.

6. The semiconductor device according to claim 4, wherein the controller is suitable for changing a storage region of the FIFO buffer using a write pointer or a read pointer during a write operation mode or a read operation mode, respectively, of the FIFO buffer.

7. The semiconductor device according to claim 4, wherein:
    if the bias information is stored in the FIFO buffer during the first program operation, the controller is suitable for increasing an address indicated by the write pointer by one, the write pointer indicating a storage region of the FIFO buffer.

8. The semiconductor device according to claim 4, wherein the microprocessor reads the bias information stored in the FIFO buffer during the second program operation so that the second program operation is performed using the program voltage having the level that is determined based on the bias information, and stores the bias information again in the FIFO buffer.

9. The semiconductor device according to claim 8, wherein the controller increases an address indicated by a write pointer and a read pointer by one during the second program operation.

10. The semiconductor device according to claim 8, wherein the microprocessor reads the bias information, which is stored in the FIFO buffer during the second program operation, during a third program operation so that the third program operation is performed using the program voltage having the level that is determined based on the bias information, and wherein the third program operation follows the second program operation.

11. The semiconductor device according to claim 10, wherein the controller increases a read pointer RP during the third program operation.

12. The semiconductor device according to claim 4, wherein the control logic comprises a plurality of FIFO buffers each of which is assigned to a corresponding one of planes of the memory cell array.

13. The semiconductor device according to claim 4, wherein the FIFO buffer is suitable for comprising a plurality of register regions identified by different addresses.

14. The semiconductor device according to claim 4, wherein the FIFO buffer is reset when a selected block of the memory cell array is changed.

15. The semiconductor device according to claim 1, wherein the control logic is suitable for detecting the number of pulses in which the 1-bit data passes the verification voltage when a least significant bit (LSB) page is programmed, store bias information corresponding to the detected number of pulses in the register, and use the bias information stored in the register when a most significant bit (MSB) page is programmed.

16. A method for operating a semiconductor device, the method comprising:
    detecting a number of program pulses when 1-bit data passes a verification voltage during a first program operation, storing bias information corresponding to the detected number of program pulses in a first-in-first-out (FIFO) buffer, and increasing an address indicated by a write pointer;
    reading the bias information stored in the FIFO buffer during a second program operation, re-storing the bias information in the FIFO buffer, and increasing the address indicated by the write pointer and a read pointer; and
    reading the bias information stored in the FIFO buffer during a third program operation, and increasing the address indicated by the read pointer.

17. The method according to claim 16, further comprising:
    when a selected block of a memory cell array is changed, resetting the FIFO buffer.

18. The method according to claim 16, further comprising:
providing a drive voltage to a memory cell array, the drive voltage being determined based on the bias information stored in the FIFO buffer.

19. The method according to claim 16, further comprising:
providing a program voltage to a memory cell array, the program voltage being determined based on the bias information stored in the FIFO buffer according to an incremental step pulse program (ISPP) scheme.

\* \* \* \* \*